United States Patent [19]

Fabien et al.

[11] Patent Number: 4,692,204
[45] Date of Patent: Sep. 8, 1987

[54] METHOD OF PLANARIZING THE SURFACE OF A SEMICONDUCTOR DEVICE, IN WHICH SILICON NITRIDE IS USED AS ISOLATING MATERIAL

[75] Inventors: Raymond Fabien, Douvres la Delivrande; Jean-Michel Decrouen, Argences, both of France

[73] Assignee: U.S. Philips Corporation, New York, N.Y.

[21] Appl. No.: 907,709

[22] Filed: Sep. 15, 1986

[30] Foreign Application Priority Data

Sep. 20, 1985 [FR] France ................................. 85 13987

[51] Int. Cl.$^4$ .................. H01L 21/306; H01L 21/318
[52] U.S. Cl. ..................................... 156/626; 156/643; 156/646; 156/653; 156/657; 156/668
[58] Field of Search ............... 156/626, 643, 646, 653, 156/657, 668; 427/94, 95

[56] References Cited

U.S. PATENT DOCUMENTS

| | | | |
|---|---|---|---|
| 4,289,188 | 9/1981 | Mizutani et al. | 156/626 |
| 4,511,430 | 4/1985 | Chen et al. | 156/643 |
| 4,515,652 | 5/1985 | Gimpelson et al. | 156/643 |
| 4,545,852 | 10/1985 | Barton | 156/643 |

*Primary Examiner*—S. Leon Bashore
*Assistant Examiner*—Andrew J. Anderson
*Attorney, Agent, or Firm*—Paul R. Miller

[57] ABSTRACT

A method of planarizing the surface of a semiconductor device comprising a substrate carrying on its surface a contact configuration, which method essentially consists in that the following steps are successively carried out:

(a) depositing a silicon nitride layer,
(b) depositing a lacquer layer, whose free surface is substantially flat,
(c) progressively attacking by plasma the lacquer layer until the farthest projecting parts of the silicon nitride layer are completely exposed, the complete appearance of these farthest projecting parts being detected by recording the intensity variations of an emitted jet of nitrogen,
(d) attacking simultaneously by plasma the silicon nitride layer and the remaining lacquer until the contact configuration completely appears.

This method is characterized in that the conditions of attack are chosen so that the rate of attack of the lacquer is higher than the rate of attack of the silicon nitride in order to detect with increased sensitivity the complete appearance of the contact configuration.

2 Claims, 5 Drawing Figures

METHOD OF PLANARIZING THE SURFACE OF A SEMICONDUCTOR DEVICE, IN WHICH SILICON NITRIDE IS USED AS ISOLATING MATERIAL

The invention relates to a method of planarizing the surface of a semiconductor device comprising a substrate carrying on its surface in relief at least one contact configuration cut out of a contact layer, which method essentially consists in that the following steps are successively carried out:

(a) depositing a silicon nitride layer having a thickness substantially equal to that of the contact layer;

(b) depositing a lacquer layer having a given thickness and then treating the said layer, the kind, the thickness and the treatment of the lacquer layer being such that the free surface of this layer is substantially flat;

(c) progressively attacking by plasma the lacquer layer until the farthest projecting parts of the silicon nitride layer are completely exposed so that a new free surface is reproduced, whose flatness is an image of that of the free surface of the lacquer layer, the complete appearance of the farthest projecting parts of the nitride layer being detected by means of a device for recording the intensity variations of an emmitted jet of nitrogen;

(d) attacking simultaneously, also by plasma, the silicon nitride layer and the remaining lacquer until the contact configuration appears completely.

The semiconductor technology actually tends to an increasing integration of a large number of components on the same monolithic circuit. This evolution leads to the use of several superimposed levels of contact configurations in order to reduce the surface area of the semiconductor device and to be able to realize on the same device functions increasing in number and in complexity.

It has been found that, when a second interconnection level should be established, difficulties are met especially due to the lack of flatness of the surface of the semiconductor device after the first contact configuration level has been realized and covered with a layer of isolating material, in this case silicon nitride. This is particularly due to the fact that the surface of the semiconductor device then has relief structures, whose thickness is equal to that of the contact layer.

In order that this technique of interconnection at several levels can be employed, it has been suggested to planarize the surface of semiconductor devices after having realized the contact configuration at the first level. According to the method described above, it is known to carry out a step of depositing a lacquer layer, for example a photosensitive lacquer, having a substantially flat free surface from which pronounced relief structures has been removed. The lacquer layer is then attacked progressively by a plasma in such conditions that the etching rate approaches the maximum rate until the farthest projecting parts of the silicon nitride layer have completely appeared. This step is controlled by means of a device for recording the intensity variations of a jet of nitrogen according to a detection method described, for example, in the article of W. R. Harshbarger et al (J. of Electronic Materials, Vol. 7, No. 3, p. 429, 1978). Finally, the silicon nitride and the remaining lacquer are attacked sumultaneously in such a manner that the contact configuration is completely exposed.

The invention has for its object to permit a reliable detection from the instant at which the contact configuration is completely exposed. In fact the use without precautions of the device for recording the intensity variations of an emitted jet of nitrogen for this purpose can prove to be inefficient. This is the case especially when the silicon nitride layer has a thickness substantially equal to that of the contact configuration and the substrate surface carrying the contact configuration is substantially equal to the substrate surface not covered by the contact configuration. In these conditions, the instant at which the contact configuration is completely exposed, cannot be determined because no substantial intensity variation of the emmitted jet of nitrogen is obtained, the quantity of released nitrogen lost during the appearance of the contact configuration being compensated for by the release quantity of nitrogen gained outside the contact configuration.

The invention is characterized in that during the simultaneous attack of the silicon nitrogen layer and of the remaining lacquer the conditions of the attack are chosen so that the rate of attack of the lacquer is higher than the rate of attack of the silicon nitride in order that the lacquer is completely removed before the appearance of the contact configuration, in order to detect with an increased sensitivity by means of the said recording device the complete appearance of the contact configuration.

Thus, the lacquer being etched away more rapidly than the silicon nitride, an instant occurs at which the nitride is level with the whole surface of the semiconductor device, which results in a substantial increase of the intensity of the considered emitted jet of nitrogen. Subsequently, when the contact configuration appears, this intensity decreases and is then stabilized when the contact configuration is completely exposed. More reliable and more sensitive means are then available for detecting the exposure of the contact configuration.

In order that the invention may be readily carried out, it will now be described more fully, by way of example, with reference to the accompanying drawings, in which.

FIGS. 1 to 4 show the different stages of a method of planarizing the surface of a semiconductor device 10 comprising a substrate 11 of semiconductor material (for example silicon) carrying on its surface 12 a contact configuration 13a, 13b cut out of a contact layer, which may be an aluminium layer having a thickness of 800 nm.

Figure 1:
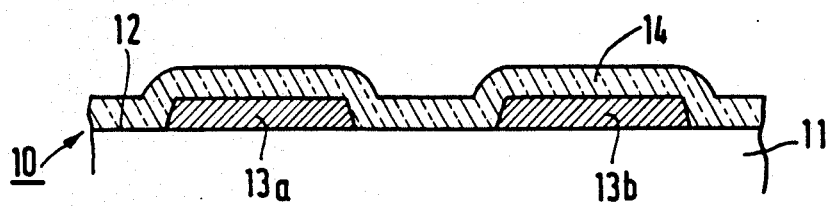
FIGS. 1 to 4 show diagrammatically in sectional view the different stages of manufacture of a semiconductor device obtained by means of the method according to the invention.

As shown in FIG. 1, a layer 14 of silicon nitride (SiN) having a thickness substantially equal to that of the contact layer is deposited on the substrate 11 and the contact configuration 13a, 13b.

Such a deposition step can be effected by formation of a plasma from silane ($SiH_4$) and nitrogen ($N_2$). At this stage of the method, the relief indicated by the layer 14 of silicon nitride reproduces exactly the relief of the contact configuration. Consequently, the nitride in not directly used in the planarization method, but serves especially as electrical isolation between the elements of the contact configuration.

Figure 2:
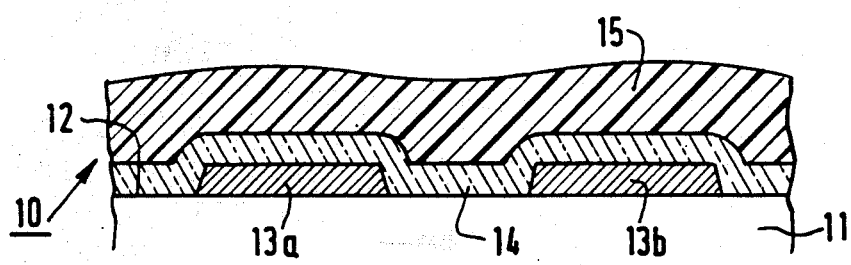

A lacquer layer 15 is then deposited over a thickness of about 1600 nm, i.e. twice the thickness of the contact layer, on the assembly of the device. The said lacquer may be a photosensitive lacquer, for example that known under the designation HPR 204 and marketed by the Company HUNT Chemical. The lacquer is preferably deposited in a double layer, after which the assembly is exposed to the UV light for 45 sec and sintered at 200° C. for 30 mn. The lacquer thus treated permits of considerably smoothing the reliefs of the surface of the device, as shown in FIG. 2.

Subsequently, the lacquer layer 15 is progressively attacked by a plasma constituted, for example, by a gaseous mixture of hexafluoro-ethane ($C_2F_6$) and oxygen ($O_2$). During this step, the conditions are chosen so that the rate of attack of the lacquer approaches the maximum rate. A rate of attack of 50 to 80 nm/min is obtained by using a gaseous mixture of 75% of $O_2$ and 25% of $CF_4$ at a pressure of the order of 0.4 mbar and activated by a radiofrequency electric field of 380 kHz. These attack conditions are maintained until the farthest projecting parts of the nitride layer 14 appear. At this instant, the method is in the stage of FIG. 3, in which the free surface of the semiconductor device reproduces to a great extent the initial free surface of the lacquer.

The appearance of the farthest projecting parts of the nitride layer is detected by means of a device for recording the variations of the intensity of an emitted jet of nitrogen. This known detection method generally consists in that the intensity variations of an emmitted jet are followed, which jet is chosen in the spectrum of the species of which the variation of the concentration in the plasma should be known. The emission spectra are known from the handbooks specialized in spectroscopy, but the choice of the jet strongly depends upon the reactive environment. In this case, the knowledge of the spectrum of nitrogen is of no use if the spectrum obtained in the etching conditions is not known. The rule is to determine by experiments, what is the jet least disturbed by the presence of other jets and most sensitive to the variation in concentration. The choice was possible between two groups of jets of nitrogen:

1 group of 2 jets between 845 and 875 nm;
1 group of 3 jets between 740 and 785 nm.

In the end, the jet at 783 nm has proved to be most sensitive.

Thus, at the beginning of the process during the attack of the lacquer along, the concentration of nitrogen is negligible and the intensity of the corresponding emitted jet is quasi zero. Subsequently, this intensity increases when the farthest projecting parts of the nitride layer appear, after which it is stabilized when the nitride is totally levelled. These two first stages are represented by the parts (a) and (b) of the diagram of FIG. 5.

Figure 3:
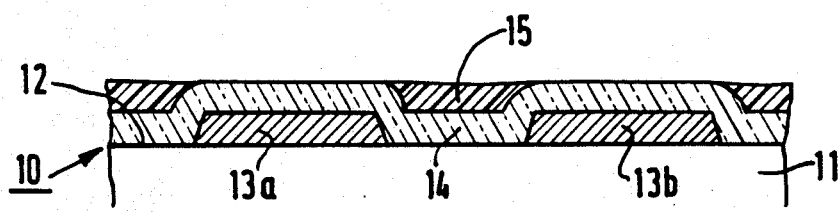
Figure 4:
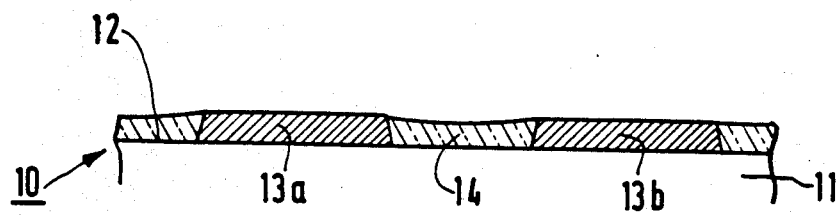
Figure 5:
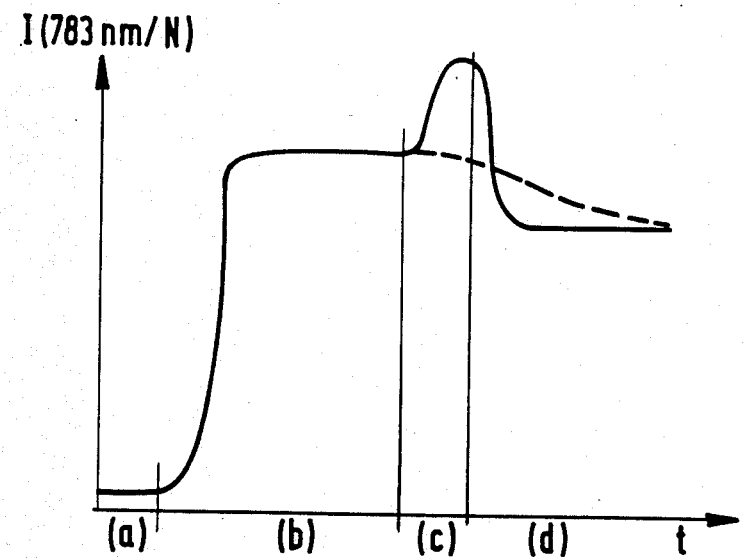
FIG. 5 shows the variations of the intensity I of an emitted jet of nitrogen during the different stages of the method according to the invention.

Starting from the situation shown in FIG. 3, the silicon nitride layer 14 and the remaining lacquer are simutaneously attacked, also by plasma, until the contact configuration 13a, 13b appears completely. It is therefore important that the instant can precisely be determined at which the contact configuration is wholly exposed. If no specific precautions are taken, it may occur that this instant can be detected only with fairly great difficulty, especially when the thickness of the nitride layer 14 is equal to that of the contact layer and when the surfaces of the contact configuration and of the exposed substrate are equivalent. A compensation is then obtained between the appearance of silicon nitride under the remaining lacquer and the disappearance of nitride when the contact configuration is exposed. In this case, a curve of variations of intensity of the emitted jet of nitrogen of the type indicated by dotted lines in FIG. 5 is obtained. It is therefore to be preferred to provide means which permit of detecting more exactly the complete exposure of the contact configuration 13a, 13b. Therefore, during the simultaneous attack of the nitride layer 14 and of the remaining lacquer, the rate of attack of the lacquer is accelerated by increasing the content of oxygen in the plasma. Thus, the lacquer is completely etched away before the contact configuration is exposed. As a result, as shown in FIG. 5, the intensity of the emitted jet of nitrogen (zone (c)) is increased and then this intensity is decreased in accordance with the exposure of the contact configuration, whereupon the intensity of the emitted jet of nitrogen is stabilized (zone (d)), when the contact configuration is completely exposed. The acceleration of the rate of erosion of the lacquer can occur from the beginning of the simultaneous attack of the nitride and of the remaining lacquer, which has the disadvantage that a lack of ultimate flatness is obtained, or at the end of the attack of the remaining lacquer, which can be less readily controlled.

The method described of planarizing the surface of a semiconductor device is stopped as soon as the intensity of the considered emitted jet has reached a constant value (FIG. 5). If desired, a second contact configuration level may then be realized.

The invention is not limited to the example described, in which a mixture of hexafluoroethane and oxygen is used; other compounds may in fact be used, such as hexafluoroethane ($C_2F_6$), trifluoromethane ($CHF_3$) or sulphur hexafluoride ($SF_6$). Likewise, oxygen may be replaced entirely or in part by a compound of oxygen, such as protoxide of nitrogen (NO).

A great advantage of the method according to the invention resides in that a layer of isolating material is provided, whose ultimate thickness is uniform.

It is then possible to subsequently etch openings into this layer by a single photomasking operation. On the contrary, according to the known methods, it is mostly necessary to provide these openings by two photomasking operations, one being used for providing openings of small dimensions at right angles to narrow parts of the contact configuration and the other being used for providing wider openings at right angles to parts of vast extent of the said configuration, the respective thicknesses of isolating layers obtained by means of these known methods being too different.

It will be appreciated that this simplification of the working process affords a great economical advantage.

What is claimed is:

1. In a method of planarizing the surface of a semiconductor device comprising a substrate carrying in relief on its surface at least one contact configuration cut out of a contact layer, which method comprises successively carrying out the following steps:
    (a) depositing a silicon nitride layer having a thickness substantially equal to that of the contact layer,
    (b) depositing a lacquer layer having a given thickness and then treating the layer, wherein the kind, the thickness and the treatment of the lacquer layer are such that the free surface of this layer is substantially flat,
    (c) progressively attacking by plasma the lacquer layer until the farthest projecting parts of the silicon nitride layer are completely exposed in order that a new free surface is reproduced, whose flatness is an image of that of the free surface of the lacquer layer, the complete appearance of the farthest projecting parts of the nitride layer being detected by means of a device for recording the intensity variations of an emitted jet of nitrogen, and (d) attacking simultaneously, also by plasma, the silicon nitride layer and the remaining lacquer until the contact configuration appears completely; the improvement comprising choosing the conditions of attack during the step of simultaneously attacking the silicon nitride layer and the remaining lacquer so that the rate of attack of the lacquer is higher than the rate of attack of the silicon nitride so that the lacquer is completely removed before the appearance of the contact configuration, in order to detect with increased sensitivity by means of the recording device the complete appearance of the contact configuration.

2. A method as claimed in claim 1, wherein the plasma is formed from a gaseous mixture containing a fluorine compound and oxygen or a compound of oxygen, and wherein the rate of attack of the lacquer is made higher than the rate of attack of the silicon nitride by increasing the quantity of the oxygen or oxygen compound in the gaseous mixture.

* * * * *